(12) United States Patent
McFarlane et al.

(10) Patent No.: US 12,464,870 B2
(45) Date of Patent: Nov. 4, 2025

(54) SEALING STRUCTURES FOR LIGHT-EMITTING DIODE PACKAGES

(71) Applicant: CreeLED, Inc., Durham, NC (US)

(72) Inventors: Tucker McFarlane, Cary, NC (US);
Robert Wilcox, Rolesville, NC (US);
David Suich, Durham, NC (US);
Thomas Celano, Cary, NC (US);
Michael Check, Holly Springs, NC (US);
Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 564 days.

(21) Appl. No.: 17/821,881

(22) Filed: Aug. 24, 2022

(65) Prior Publication Data
US 2024/0072212 A1  Feb. 29, 2024

(51) Int. Cl.
*H01L 33/48* (2010.01)
*H10H 20/85* (2025.01)
*H10H 20/853* (2025.01)
*H10H 20/855* (2025.01)
*H10H 20/825* (2025.01)

(52) U.S. Cl.
CPC ...... *H10H 20/8506* (2025.01); *H10H 20/853* (2025.01); *H10H 20/855* (2025.01); *H10H 20/825* (2025.01)

(58) Field of Classification Search
CPC ............. H10F 77/331; H10H 20/8506; H10H 20/853; H10H 20/855; H10H 20/856; H10H 20/854; H10H 20/0362; H10H 20/841; H10H 20/851; H10H 20/8511; H01L 2924/181; H01L 2924/12041
See application file for complete search history.

(56) References Cited

U.S. PATENT DOCUMENTS

| | | | |
|---|---|---|---|
| 8,168,998 B2 * | 5/2012 | David ................. | H10H 20/854 257/E33.001 |
| 2008/0074029 A1 * | 3/2008 | Suehiro ................ | H01L 24/97 257/E33.059 |
| 2009/0078959 A1 * | 3/2009 | Suehiro ................ | C03C 8/08 257/E33.058 |
| 2010/0308354 A1 * | 12/2010 | David ................. | H10H 20/856 438/27 |

(Continued)

OTHER PUBLICATIONS

International Search Report and Written Opinion for International Patent Application No. PCT/US2023/071589, mailed Oct. 30, 2023, 13 pages.

*Primary Examiner* — Jaehwan Oh
(74) *Attorney, Agent, or Firm* — Withrow & Terranova, P.L.L.C.

(57) ABSTRACT

Solid-state lighting devices including light-emitting diodes (LEDs) and more particularly sealing structures for LED packages are disclosed. Sealing structures include multiple seals within an LED package that provide a multiple barrier structure for enhanced protection from elemental ingress from a surrounding environment. Certain seals may be provided as bonding materials between cover structures and submounts of LED packages, thereby enclosing LED chips. Additional seals may be provided as coatings on surfaces of LED chips and/or submounts that are between cover structures and LED chips. Sealing structures may include multiple levels of hermetic seals with LED packages.

22 Claims, 6 Drawing Sheets

(56) References Cited

U.S. PATENT DOCUMENTS

| | | | |
|---|---|---|---|
| 2015/0274894 A1* | 10/2015 | Sato | G02F 1/1336 |
| | | | 525/474 |
| 2016/0013374 A1* | 1/2016 | Dijken | F21K 9/64 |
| | | | 257/98 |
| 2018/0040786 A1* | 2/2018 | Chen | H10H 20/854 |
| 2018/0138102 A1* | 5/2018 | Pan | H10H 20/852 |
| 2019/0081218 A1* | 3/2019 | Dawson-Elli | H10H 20/8512 |
| 2022/0069172 A1 | 3/2022 | Weare et al. | |
| 2022/0190208 A1* | 6/2022 | Miller | H10H 20/841 |
| 2023/0112649 A1* | 4/2023 | Blakely | H10H 20/8506 |
| | | | 257/79 |
| 2023/0307595 A1* | 9/2023 | Tamaki | H10H 20/856 |

* cited by examiner

SEALING STRUCTURES FOR LIGHT-EMITTING DIODE PACKAGES

FIELD OF THE DISCLOSURE

The present disclosure relates to solid-state lighting devices including light-emitting diodes (LEDs) and more particularly to sealing structures for LED packages.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible. A practical goal to enhance emission efficiency is to maximize extraction of light emitted by the active region in the direction of the desired transmission of light. LED packages have been developed that can provide mechanical support, electrical connections, and encapsulation for LED chips with suitable emission efficiencies. During operation in various environments, adverse exposure to environmental conditions can lead to performance degradation of LED packages and associated LED chips. As such, there can be challenges in producing high quality light with desired emission characteristics while also providing high light emission efficiency in LED packages.

The art continues to seek improved LEDs and solid-state lighting devices having desirable illumination characteristics capable of overcoming challenges associated with conventional lighting devices.

SUMMARY

The present disclosure relates to solid-state lighting devices including light-emitting diodes (LEDs) and more particularly to sealing structures for LED packages. Sealing structures include multiple seals within an LED package that provide a multiple barrier structure for enhanced protection from elemental ingress from a surrounding environment. Certain seals may be provided as bonding materials between cover structures and submounts of LED packages, thereby enclosing LED chips. Additional seals may be provided as coatings on surfaces of LED chips and/or submounts that are between cover structures and LED chips. Sealing structures may include multiple levels of hermetic seals with LED packages.

In one aspect, an LED package comprises: a submount comprising a first side and a second side that opposes the first side; at least one LED chip on the first side of the submount; a cover structure arranged over the at least one LED chip, the cover structure being attached to the submount to form a first seal between the cover structure and the submount, the first seal being a first hermetic seal; and a second seal on the LED chip and on a surface of the submount that is adjacent the LED chip, the second seal comprising inorganic materials. In certain embodiments, the second seal is a second hermetic seal. The LED package may further comprise a metal trace on the first side of the submount, the metal trace forming at least one reflective surface for the at least one LED chip, wherein the second seal is on a surface of the metal trace. In certain embodiments, the cover structure forms a cavity on the submount, the second seal and the at least one LED chip are positioned within the cavity, and the second seal covers all surfaces of the at least one LED chip and the submount that are within the cavity such that the cavity is bounded by the cover structure and the second seal. In certain embodiments, the cover structure forms a cavity on the submount, and the second seal covers all surfaces of the at least one LED chip and a portion of the submount within the cavity such that a gap is formed on the submount between the second seal and the first seal. In certain embodiments, a portion of the second seal is in contact with the first seal. In certain embodiments, the second seal comprises a thickness that is less than a thickness of the at least one LED chip as measured in a direction perpendicular to the submount. In certain embodiments, a thickness of the second seal is in a range from 1 nanometer (nm) to 20 microns (µm) as measured in a direction perpendicular to the submount. In certain embodiments, the cover structure forms a cavity on the submount, and the second seal comprises an index of refraction that is intermediate an index of refraction for the at least one LED chip and an index of refraction for an environment of the cavity. In certain embodiments, the cover structure forms a curved lens or a flat lens above the at least one LED chip. In certain embodiments, the first seal comprises a metal-to-metal eutectic bond, a solder bond, a glass bond, or a ceramic bond. The LED package may further comprise a spacer on the submount, wherein the first seal is formed between the spacer and the cover structure. The LED package may further comprise a lumiphoric material, wherein the second seal is arranged between the lumiphoric material and the at least one LED chip. The LED package may further comprise a lumiphoric material, wherein the lumiphoric material is arranged between the second seal and the at least one LED chip. The LED package may further comprise a third seal on the second seal, wherein at least one of the second seal and the third seal is a second hermetic seal. In certain embodiments, the at least one LED chip is configured to provide a peak wavelength in a range from 100 nm to 400 nm.

In another aspect, an LED package comprises: a submount comprising a first side and a second side that opposes the first side; at least one LED chip on the first side of the submount; a cover structure arranged over the at least one LED chip, the cover structure being attached to the submount to form a first seal between the cover structure and the submount; and a second seal on the LED chip and on a surface of the submount that is adjacent the at least one LED chip, the second seal being a hermetic seal that is between the cover structure and the at least one LED chip. In certain embodiments, the cover structure forms a cavity on the submount, and the hermetic seal and the at least one LED chip are positioned within the cavity. In certain embodiments, the first seal comprises an organic material and the second seal comprises an inorganic material. In certain embodiments, the first seal comprises another hermetic seal. The LED package may further comprise a metal trace on the first side of the submount, the metal trace forming at least one reflective surface for the at least one LED chip, wherein the second seal is on a surface of the metal trace. In certain embodiments, the at least one LED chip is configured to provide a peak wavelength in a range from 100 nanometers nm to 400 nm.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to solid-state lighting devices including light-emitting diodes (LEDs) and more particularly to sealing structures for LED packages. Sealing structures include multiple seals within an LED package that provide a multiple barrier structure for enhanced protection from elemental ingress from a surrounding environment. Certain seals may be provided as bonding materials between cover structures and submounts of LED packages, thereby enclosing LED chips. Additional seals may be provided as coatings on surfaces of LED chips and/or submounts that are between cover structures and LED chips. Sealing structures may include multiple levels of hermetic seals with LED packages.

Before delving into specific details of various aspects of the present disclosure, an overview of various elements that may be included in exemplary LED packages of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm. In certain embodiments, the active LED structure may be configured to emit light that is outside the visible spectrum, including one or more portions of the ultraviolet (UV) spectrum. The UV spectrum is typically divided into three wavelength range categories denoted with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications.

The LED chip can also be covered with one or more lumiphoric or other conversion materials, such as phosphors, such that at least some of the light from the LED chip is absorbed by the one or more phosphors and is converted to one or more different wavelength spectra according to the characteristic emission from the one or more phosphors. In some embodiments, the combination of the LED chip and the one or more phosphors emits a generally white combination of light. The one or more phosphors may include yellow (e.g., YAG:Ce), green (e.g., LuAg:Ce), and red (e.g., Cai-x-ySrxEuyAlSiN3) emitting phosphors, and combinations thereof. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In some embodiments, one or more phosphors may include yellow phosphor (e.g., YAG:Ce), green phosphor (e.g., LuAg:Ce), and red phosphor (e.g., Cai-x-ySrxEuyAlSiN3) and combinations thereof. One or more lumiphoric materials may be provided on one or more portions of an LED chip and/or a submount in various configurations.

Light emitted by the active layer or region of an LED chip may typically travel in a variety of directions. For targeted directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer is arranged between the metal reflector layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure may be useful for LED chips having a variety of geometries, including flip-chip geometries. Flip-chip structures for LED chips typically include anode and cathode connections that are made from a same side or face of the LED chip. The anode and cathode side is typically structured as a mounting face of the LED chip for flip-chip mounting to another surface, such as a printed circuit board. In this regard, the anode and cathode connections on the mounting face serve to mechanically bond and electrically couple the LED chip to the other surface. When flip-chip mounted, the opposing side or face of the LED chip corresponds with a light-emitting face that is oriented toward an intended emission direction. In certain embodiments, a growth substrate for the LED chip may form and/or be adjacent to the light-emitting face when flip-chip mounted. During chip fabrication, the active LED structure may be epitaxially grown on the growth substrate.

According to aspects of the present disclosure, LED packages may include one or more elements, such as lumiphoric materials, encapsulants, light-altering materials, lenses, and electrical contacts, among others, that are provided with one or more LED chips. In certain aspects, an LED package may include a support member, such as a submount or a lead frame. Light-altering materials may be arranged within LED packages to reflect or otherwise redirect light from the one or more LED chips in a desired emission direction or pattern. As used herein, light-altering materials may include many different materials including light-reflective materials that reflect or redirect light, light-absorbing materials that absorb light, and materials that act as a thixotropic agent.

Aspects of the present disclosure are provided that include support structures for LED packages. A support structure may refer to a structure of an LED package that supports one or more other elements of the LED package, including but not limited to LED chips and cover structures. In certain embodiments, a support structure may include a submount on which an LED chip is mounted. Suitable materials for a submount include, but are not limited to, ceramic materials such as aluminum oxide or alumina, AlN, or organic insulators like polyimide (PI) and polyphthalamide (PPA). In other embodiments a submount may comprise a printed circuit board (PCB), sapphire, Si, or any other suitable material. For PCB embodiments, different PCB types can be used such as standard FR-4 PCB, metal core PCB, or any other type of PCB. In still further embodiments, the support structure may embody a lead frame structure. Aspects of the present disclosure are provided in the context of support structures for LED chips that may emit light in any number of wavelength ranges, including wavelengths within UV and/or visible light spectrums.

UV LEDs are of particular interest for use in applications related to the disinfection of microorganisms in air, water, and on surfaces, among others. In other applications, UV LEDs may also be provided with one or more lumiphoric materials to provide aggregated broad emissions with improved color quality in the visible spectrum. Certain embodiments of the present disclosure may be well suited for applications where LED emissions are provided in one or more of the UV-A, UV-B, and UV-C wavelength ranges. Lower peak wavelengths, such as peak wavelengths in one or more of the UV-B (e.g., 280 nm to 315 nm) and the UV-C (e.g., 100 nm to 280 nm) wavelength ranges, may have high energy levels that can lead to breakdown of materials commonly used in other LED packages, including silicone, polymers, and/or other organic materials that are commonly used as encapsulants and/or binders for reflective particles and/or lumiphoric materials. Cover structures for UV-based LED packages may also need to provide protection from external environmental exposure, such as providing hermetic sealing and the like. In this manner, cover structures for UV LEDs may include at least one of glass, quartz, and/or ceramic materials that provide reduced breakdown from exposure to UV emissions while also being able to be attached or otherwise bonded to package support structures to seal underlying LED chips.

Support structures for LED packages may include one or more electrically conductive materials that may provide electrical connections to LED chips. Electrically conductive materials may be provided as metal traces or patterned metal traces on a submount, or the electrically conductive materials may form a lead frame structure that may or may not include a corresponding submount. The electrically conductive materials may include any number of materials, including copper (Cu) or alloys thereof, nickel (Ni) or alloys thereof, nickel chromium (NiCr), gold (Au) or alloys thereof, electroless Au, electroless silver (Ag), NiAg, Al or alloys thereof, titanium tungsten (TiW), titanium tungsten nitride (TiWN), electroless nickel electroless palladium immersion gold (ENEPIG), electroless nickel immersion gold (ENIG), hot air solder leveling (HASL), and organic solderability preservative (OSP). In certain embodiments, the electrically conductive materials may include ENEPIG or ENIG that include a top layer of Au. In other embodiments, electrically conductive materials may include a top layer of Ag. For UV-B and UV-C wavelength spectrums, Au and Ag exhibit poor reflectivity (e.g., about 20% to 40% reflectivity). In such embodiments, a layer with increased reflectivity relative to UV emissions, such as Al, may be arranged on or otherwise incorporated with the electrically conductive materials.

During operation of LED packages, exposure to surrounding environments can adversely impact operation. For example, moisture ingress can cause metal migration of materials from electrical traces and/or metal reflective layers within a package. Such metal migration can lead to various failure modes, such as electrical shorting, current leakage, and reduced brightness, among others. In another example, sulfur contamination can lead to corrosion of metals, thereby reducing reflectivity and overall brightness. In the context of UV LEDs, Al may be present in increased quantities, such as within the active LED structure itself to provide UV wavelengths and/or incorporated with electrical trace metals as reflective surfaces. Al may be particularly susceptible to degradation associated with the above-described environmental exposure. As disclosed herein, sealing structures for LED packages are disclosed that provide increased protection from stress associated with elemental forces from a surrounding environment. Such sealing structures include multiple levels of sealing materials, including hermetic seals, that create multiple environmental barriers for elemental ingress.

As used herein, a hermetic seal generally refers to a seal that is airtight and watertight, thereby preventing the passage of air, gases, and/or liquids. In this regard, organic materials, such as silicone and epoxies, are not considered hermetic seals due to air permeability. As used herein, a hermetic seal may include any number of inorganic materials, including glass, ceramics, and/or metals. Particular examples of such hermetic seals include metal-to-metal bonds, fusion bonding between glass and silicon substrates or pillars, and ceramic adhesives to glass, any of which may be employed to bond cover structures to submounts, thereby enclosing LED chips or other electronic devices. Other hermetic seals are described in the form of inorganic thin films of aluminum oxide ($Al_2O_3$), silicon dioxide ($SiO_2$), and silicon nitride (SiN) that may be formed as coatings that cover LED chips or other electronic devices. Such inorganic thin films may be formed by atomic layer deposition, chemical vapor deposition, thermal evaporation, sputtering, drop dispense, and/or by spin coating.

Figure 1:
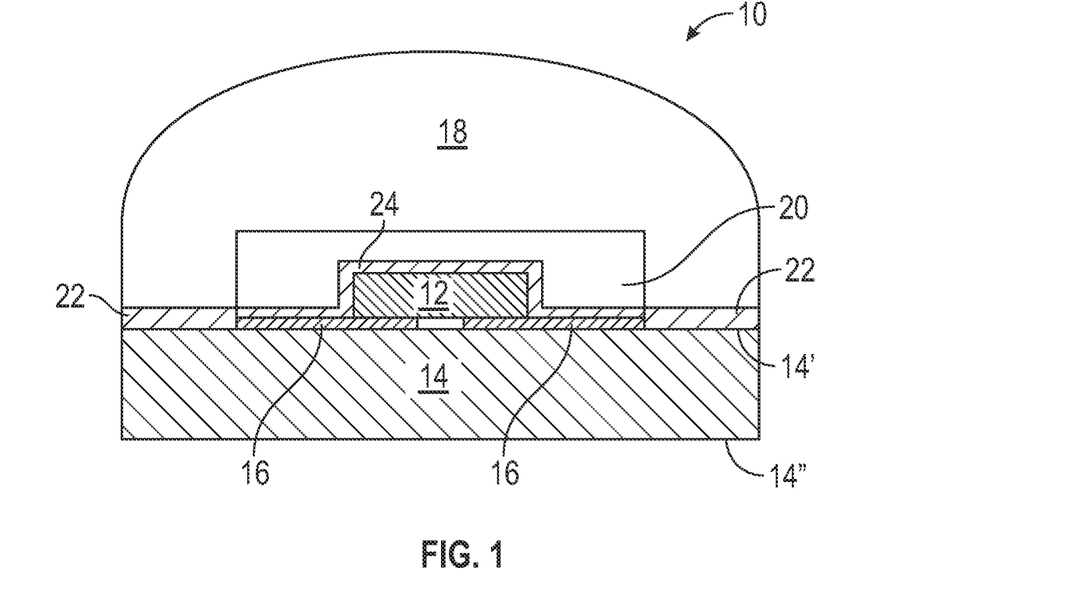
FIG. 1 is a cross-section of a light-emitting diode (LED) package with first and second seals according to principles of the present disclosure.

FIG. 1 is a cross-section of an LED package 10 with sealing structures according to principles of the present disclosure. In FIG. 1, an LED chip 12 is mounted on a submount 14. As indicated above, support structures for LED packages may embody any of a submount, a printed circuit board, or a lead frame structure according to principles of the present disclosure. By way of example, the LED package 10 is discussed in the context of the submount 14. A number of metal traces 16 may be arranged on a first side 14', or topside, of the submount 14, and the LED chip 12 may be electrically coupled to one or more of the metal traces 16. The metal traces 16 may include one or more of copper, gold, ENEPIG, ENIG, and Al. In certain aspects, the metal traces 16 may embody a multiple layer structure of any of the aforementioned materials. The metal traces 16 may form at least one reflective surface for redirecting light from the LED chip 12 in a desired emission direction. For example, a layer of Al may be provided at a top surface of the metal traces 16 to provide enhanced reflectivity, particularly for UV embodiments. In certain aspects, the LED chip 12 is configured to provide a peak wavelength in the visible spectrum or a peak wavelength in a range from 100 nm to 400 nm, such as one or more peak wavelength ranges defined above for UV-A, UV-B, or UV-C. In FIG. 1, the LED chip 12 embodies a flip-chip LED structure such that anode and cathode electrical contacts of the LED chip 12 are arranged on a same side of the LED chip 12 such that the LED chip 12 may be flip-chip mounted and electrically coupled with one or more of the metal traces 16. A second side 14", or bottom side, of the submount 14 that is opposite the first side 14' may embody a mounting side of the LED package 10.

A cover structure 18 is arranged on the submount 14 and over the LED chip 12. The cover structure 18 may form a cavity 20 or opening over the LED chip 12 and over the submount 14. In certain embodiments, the cavity 20 may be filled with air and/or nitrogen. The cavity 20 may be under a vacuum relative to a surrounding atmosphere, depending on how the cover structure 18 is attached to the submount 14. In certain embodiments, the cover structure 18 is attached or otherwise bonded to the submount 14 by way of a first seal 22. The first seal 22 may be arranged around a perimeter of the submount 14, thereby sealing the cavity 20 about the LED chip 12. The first seal 22 may form a hermetic seal for the cavity 20 and the LED chip 12. A cover structure mounting area may be defined where the cover structure 18 is attached to the submount 14 by way of the first seal 22. In certain embodiments, the metal traces 16 may only partially extend on the submount 14 such that the first seal 22 is provided outside an area of the metal traces 16. In other embodiments, the metal traces 16 may extend within the cover structure mounting areas such that the first seal 22 bonds the cover structure 18 to portions of the metal traces 16. As illustrated, the cover structure 18 may form a lens with a domed or hemispherical shape for directing light emissions from the LED chip 12. The lens may form many different shapes depending on the desired shape of the light output. Suitable shapes include hemispheric, ellipsoid, ellipsoid bullet, cubic, flat, hex-shaped and square. In certain embodiments, a suitable shape includes both curved and planar surfaces, such as a hemispheric or curved top portion with planar side surfaces.

The LED package 10 may further include a second seal 24 that is provided as a thin film or coating over the LED chip 12 and extends to surfaces of the submount 14 that are adjacent the LED chip 12. The second seal 24 may embody a conformal coating that generally contours along a shape of the LED chip 12 and the submount 14. In certain aspects, the second seal 24 may cover exposed portions of the metal traces 16 within the cavity 20. In still further aspects, the second seal 24 may cover all exposed surfaces of the LED chip 12 and the submount 14 within the cavity 20. Accordingly, the cavity 20 may be bounded by the cover structure 18 and the second seal 24. As illustrated, the second seal 24 may extend along the submount 14 to a position that contacts the first seal 22. In certain embodiments, the second seal 24 comprises inorganic materials in order to provide increased resistance to air and/or water ingress. In still further embodiments, the second seal 24 is also a hermetic seal. By providing the second seal 24 as described above, a second layer of protection is provided for the LED chip 12 and/or portions of the metal traces 16. In this manner, if integrity of the first seal 22 is compromised, the LED package 10 may still be resistant to performance degradation associated with environmental exposure by way of the second seal 24.

The second seal 24 may comprise a thickness that is less than a thickness of the LED chip 12 as measured in a direction perpendicular to the submount 14. Depending on the material and type of deposition, the second seal 24 may have a thickness that is in a range from 1 nm to about 20 microns (μm), or in a range from 1 nm to 5 μm. Atomic layer deposition (ALD) may be employed for thinner values, such as 1 nm to 10 nm, while chemical vapor deposition (CVD) may be employed for values in a range from 50 nm to 1 μm, and spin coating, such as spin-on glass, may be employed for thicknesses in a range from 100 nm to 20 μm. In addition to the above-described sealing properties, the second seal 24 may also be configured to enhance light extraction of light exiting the LED chip 12. For example, the second seal 24 may be formed of a material with an index of refraction that is intermediate the LED chip 12 and the environment of the cavity 20, thereby increasing amounts of light that pass from the LED chip 12, through the second seal 24, and into the cavity 20.

The structure of the LED package 10 may be suited for embodiments where the LED chip 12 provides a peak wavelength in any of the visible spectrum or the UV spectrums. LED packages where LED chips provide UV spectrums, and in particular the deeper UV spectrums, may be particularly vulnerable to performance degradation associated with environmental ingress. In this regard, the principles of the present disclosure may be well suited for challenging deep UV spectrums, such as UV-C.

Figure 2:
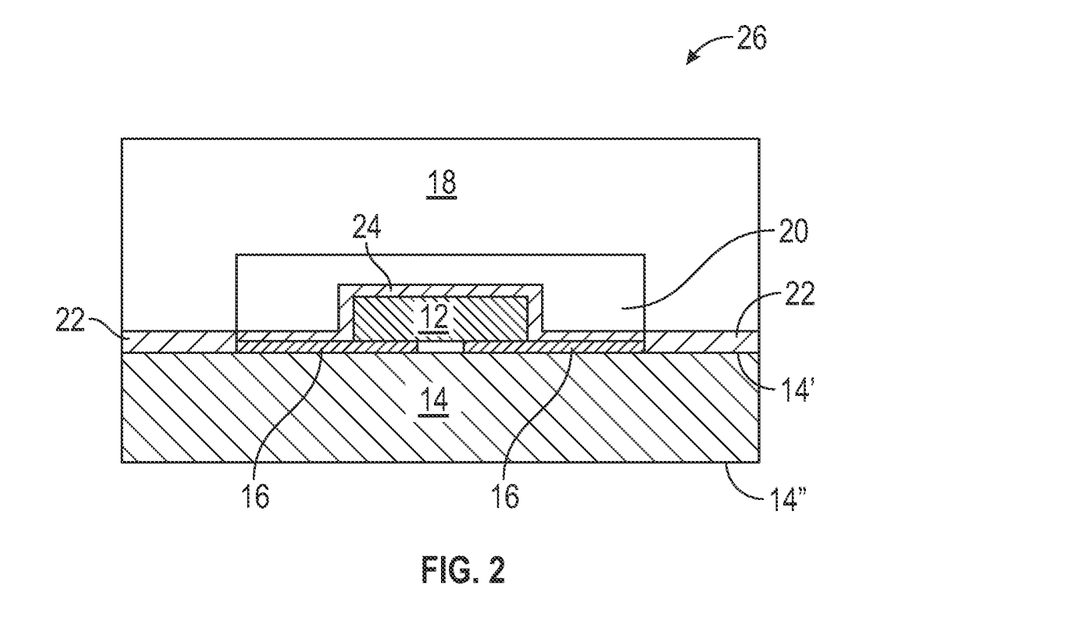
FIG. 2 is a cross-section of an LED package that is similar to the LED package of FIG. 1 where a cover structure forms a flat or planar cover over the submount.

FIG. 2 is a cross-section of an LED package 26 that is similar to the LED package 10 of FIG. 1 where the cover structure 18 forms a flat or planar cover over the submount 14. The cover structure 18 may include a flat or planar top surface above the LED chip 12 with vertical sidewalls that extend to the submount 14, thereby forming the cavity 20. In this regard, the LED package 26 may be provided with a lower profile for certain applications, while still providing enhanced sealing by way of the first seal 22 and the second seal 24.

FIGS. 3-7 illustrate exploded cross-sections of exemplary LED packages that are similar to the LED package 10 of FIG. 1 and provide various examples of the first seal 22. In each of FIGS. 3-7, the exploded view is provided at a fabrication step before the cover structure 18 is attached to the submount 14 by way of the first seal 22. Superimposed vertical arrows are illustrated indicating a mounting direction for the cover structure 18 to the submount 14. While FIGS. 3-7 are illustrated in the context of LED packages that are similar to the LED package 10 of FIG. 1, the principles are equally applicable to the LED package 26 of FIG. 2 and all other later-described LED packages with the first seal 22.

Figure 3:
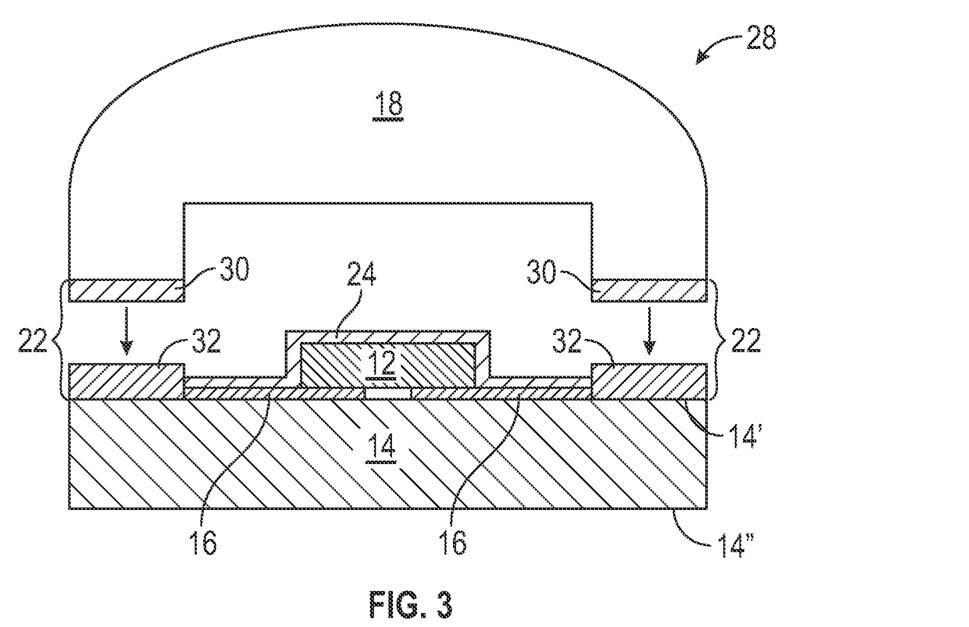
FIG. 3 is a cross-section of an LED package that is similar to the LED package of FIG. 1 for embodiments where the first seal may be formed by bonding two metals to one another.

FIG. 3 is a cross-section of an LED package 28 that is similar to the LED package 10 of FIG. 1 for embodiments where the first seal 22 may be formed by bonding two metals to one another. As illustrated, a first bond metal may be arranged along a perimeter of the cover structure 18 and a second bond metal 32 may be arranged in a corresponding manner at or near a perimeter of the submount 14. During attachment, the cover structure 18 may be joined to the submount 14 in a direction indicated by the downward facing arrows such that the first bond metal 30 contacts the second bond metal 32. As such, the first seal 22 comprises the first bond metal 30 and the second bond metal 32 bonded together, such as with a eutectic bond. The first and second bond metals 30, 32 may be sealed together to form the first seal 22 by, for example, thermocompression bonding. In certain aspects, the first bond metal 30 may comprise Au or alloys thereof while the second bond metal 32 may comprise gold-tin (AuSn). Other metal-to-metal eutectic bonds may also be employed without deviating from the principles disclosed.

Figure 4:
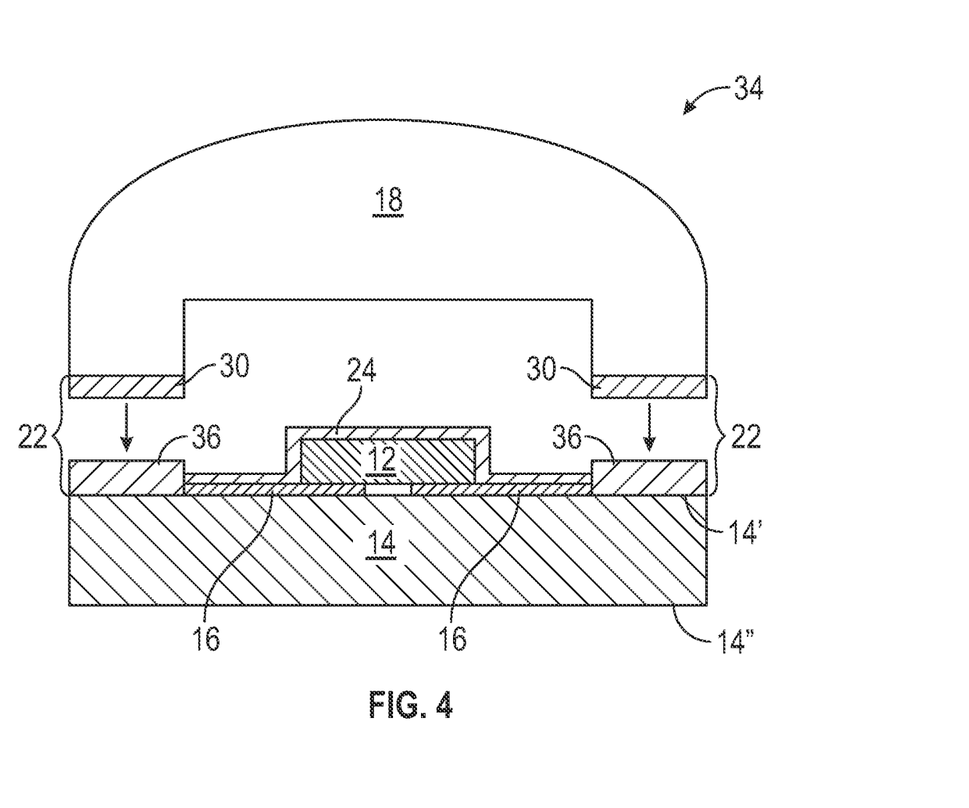
FIG. 4 is a cross-section of an LED package that is similar to the LED package of FIG. 1 for embodiments where the first seal may be formed by bonding the cover structure to the submount with a solder material.

FIG. 4 is a cross-section of an LED package 34 that is similar to the LED package 10 of FIG. 1 for embodiments where the first seal 22 may be formed by bonding the cover structure 18 to the submount with a solder material 36. For example, the first bond metal 30 may be arranged on the cover structure 18 in a similar manner as described above for FIG. 3, and a solder material 36, such as solder paste or a patterned solder, may be provided on the submount 14 to receive the first bond metal 30 during attachment.

Figure 5:
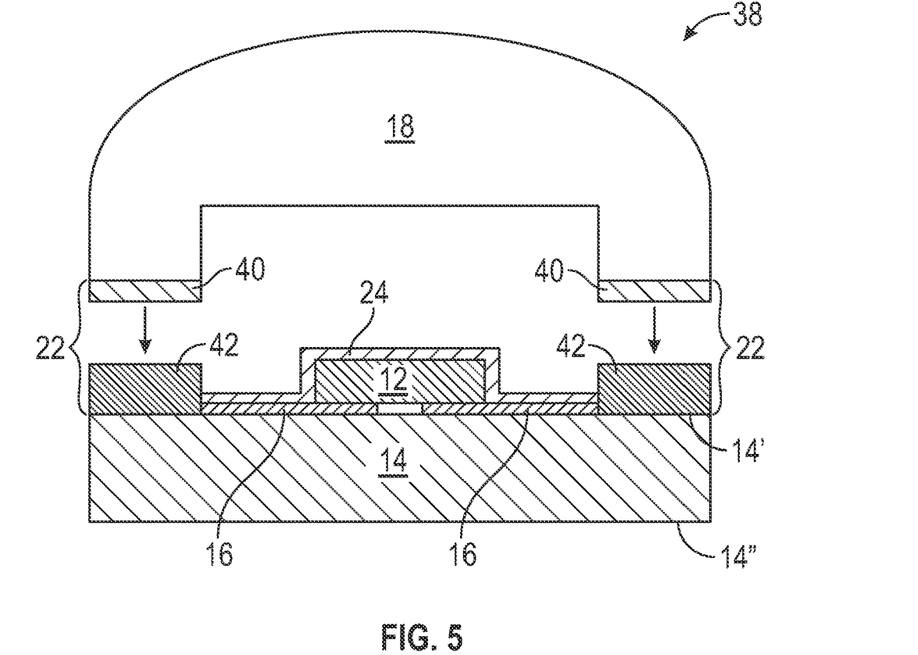
FIG. 5 is a cross-section of an LED package that is similar to the LED package of FIG. 1 for embodiments where the first seal is formed by bonding a bonding glass to a spacer of the submount.

FIG. 5 is a cross-section of an LED package 38 that is similar to the LED package 10 of FIG. 1 for embodiments where the first seal 22 is formed by bonding a bonding glass 40 to a spacer 42 of the submount 14. The spacer 42 may provide a mounting surface for the cover structure 18 that is spaced from the first side 14' of the submount 14. In certain embodiments, the spacer 42 may comprise a separate material from the submount 14, such as portion of a silicon substrate that is bonded to the submount 14. In other embodiments, the spacer 42 may be formed with a same material and in a continuous and unitary manner with the submount 14. During attachment, the cover structure 18 may be bonded to the submount 14 by fusion bonding the bonding glass 40 to the spacer 42. In certain embodiments, the bonding glass 40 may embody a separate material from the cover structure 18 while in other embodiments, the bonding glass 40 may embody a same material or even a surface of the cover structure 18. In certain embodiments, the bonding glass 40 comprises $SiO_2$.

Figure 6:
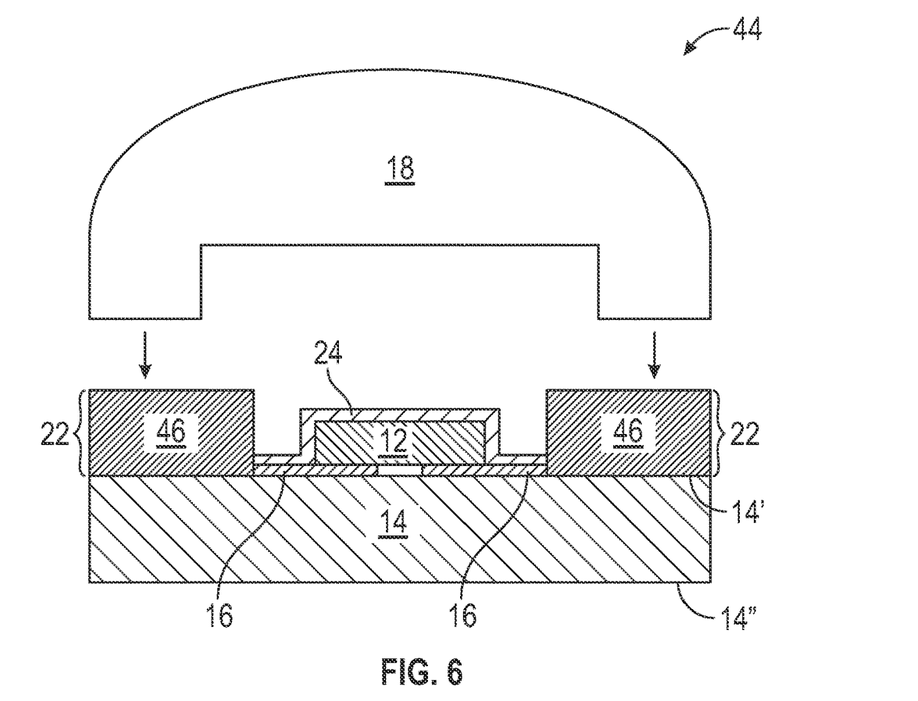
FIG. 6 is a cross-section of an LED package that is similar to the LED package of FIG. 1 for embodiments where the first seal is formed by a ceramic bond.

FIG. 6 is a cross-section of an LED package 44 that is similar to the LED package 10 of FIG. 1 for embodiments where the first seal 22 is formed by a ceramic bond. The ceramic bond may be formed by placing a ceramic adhesive 46 between the submount 14 and the cover structure 18 and curing the ceramic adhesive 46 in place to provide the first seal 22. In certain embodiments, the ceramic adhesive 46 may be formed of a white material that increases reflectivity of light from the LED chip 12. In this manner, a height or thickness of the ceramic adhesive 46 may be used to control emission patterns for the LED package 44 where a greater thickness may concentrate the emission pattern to a tighter beam while a lower thickness may provide a wider emission pattern. By way of example, FIG. 6 illustrates an example where a height or thickness of the ceramic adhesive 46, or first seal 22, may be greater than a height or thickness of the LED chip 12 as measured in a direction perpendicular to the submount 14.

Figure 7:
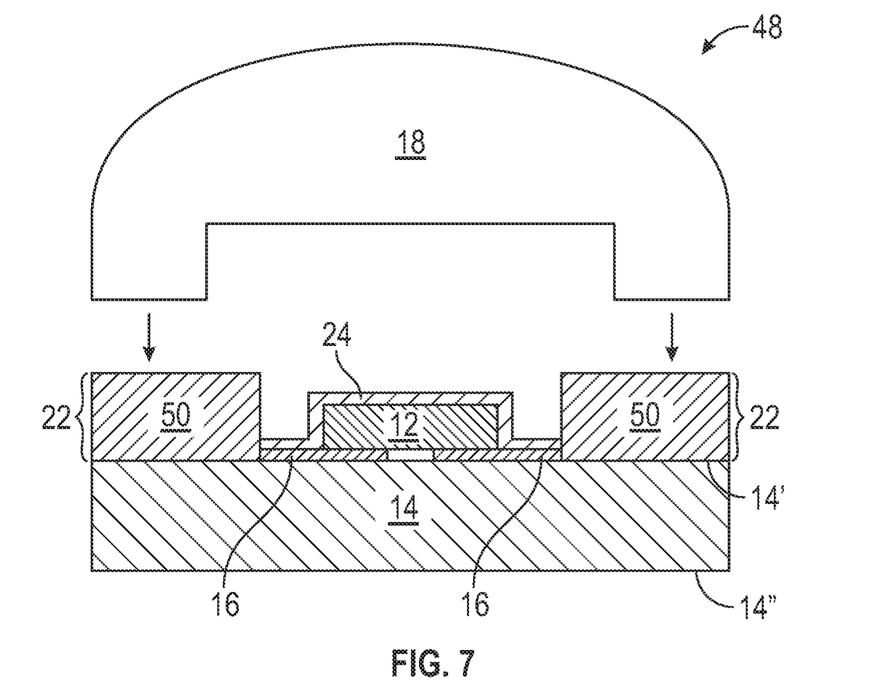
FIG. 7 is a cross-section of an LED package that is similar to the LED package of FIG. 1 for embodiments where the first seal is not necessarily a hermetic seal.

FIG. 7 is a cross-section of an LED package 48 that is similar to the LED package 10 of FIG. 1 for embodiments where the first seal 22 is not necessarily a hermetic seal. In certain embodiments, a hermetic seal provided by the second seal 24 may be sufficient to form a moisture and/or air barrier for the LED chip 12 and/or the metal traces 16. In this manner, the cover structure 18 for the LED package 48 may be attached by way of an organic or soft adhesive attach material 50, for example silicone or epoxy. Even though the first seal 22 in FIG. 6 does not form a hermetic seal at the perimeter of the LED package 48, the integrity of the second seal 24 may prevent performance degradation associated with environmental ingress.

Figure 8:
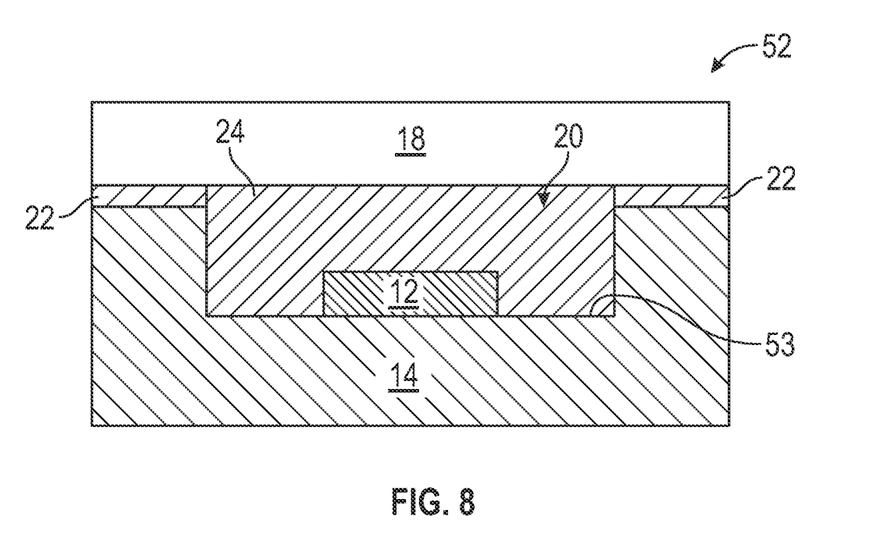
FIG. 8 is a cross-section of an LED package that is similar to the LED package of FIG. 1 for embodiments where the first seal is a hermetic seal, and the second seal is formed to fill the cavity between the cover structure and the submount.

FIG. 8 is a cross-section of an LED package 52 that is similar to the LED package 10 of FIG. 1 for embodiments where the first seal 22 is a hermetic seal, and the second seal 24 is formed to fill the cavity 20 between the cover structure 18 and the submount 14. In such embodiments, the second seal 24 may be provided in a liquid or gel form to effectively encapsulate the LED chip 12 within the cavity 20. As illustrated, the cavity 20 may be at least partially formed by a recess 53 formed within the submount 14. Accordingly, the LED chip 12 may be mounted within the recess 53, the second seal 24 may be provided within the recess 53 to cover the LED chip 12, and the cover structure 18 may embody a planar shape that is bonded to a surface of the submount 14 outside the recess 53 by way of the first seal 22. In other embodiments, the recess 53 may be formed by a spacer structure similar to the spacer 42 of FIG. 5.

Figure 9:
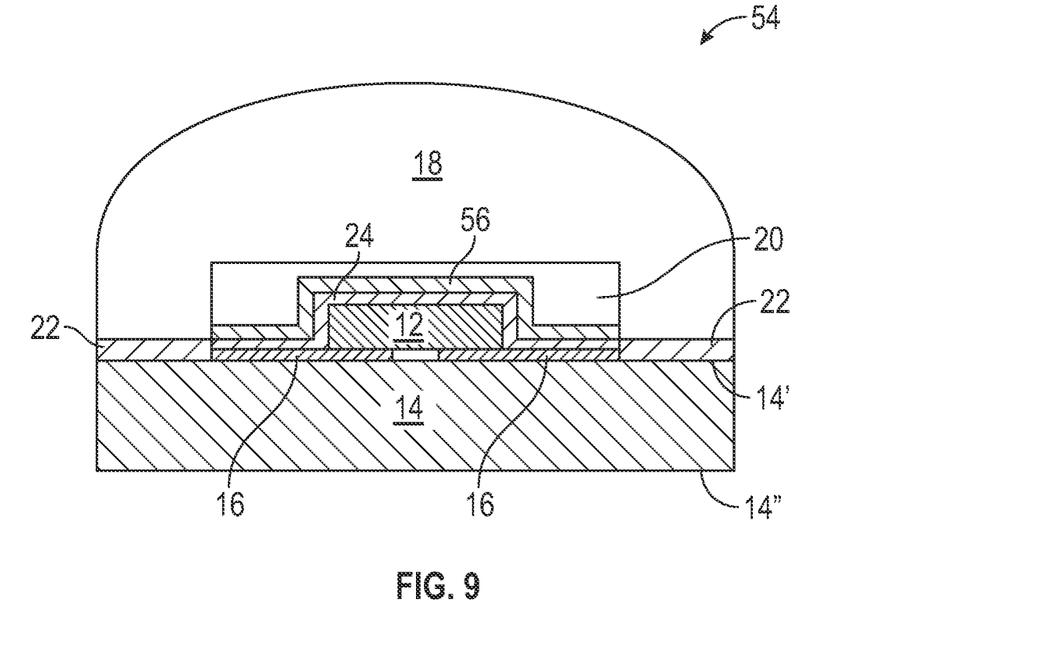
FIG. 9 is a cross-section of an LED package that is similar to the LED package of FIG. 1 for embodiments that further include a lumiphoric material arranged on the second seal.

FIG. 9 is a cross-section of an LED package 54 that is similar to the LED package 10 of FIG. 1 for embodiments that further include a lumiphoric material 56 arranged on the second seal 24. As illustrated, the lumiphoric material 56 may be provided in the form of a coating that conforms to a topography of the LED chip 12 and the second seal 24. The lumiphoric material 56 may accordingly be arranged in light paths from the LED chip 12 such that a portion of light from the LED chip 12 may be subject to wavelength conversion. In certain embodiments, the lumiphoric material 56 comprises phosphor particles in a binder of silicone. As illustrated, the second seal 24 is provided between the lumiphoric material 56 and the LED chip 12. In certain embodiments, the index of refraction of the second seal 24 may have a value that is intermediate the index of refraction of the LED chip 12 and the lumiphoric material 56. For example, in flip-chip structures, a sapphire substrate with an index of refraction of about 1.8 forms a light exiting face of the LED chip 12 and silicone of the lumiphoric material 56 may have an index of refraction of about 1.42. Accordingly, the second seal 24 may be formed of a material with an index of refraction with a value that is intermediate 1.8 and 1.42 for enhanced light extraction along with the improved sealing.

Figure 10:
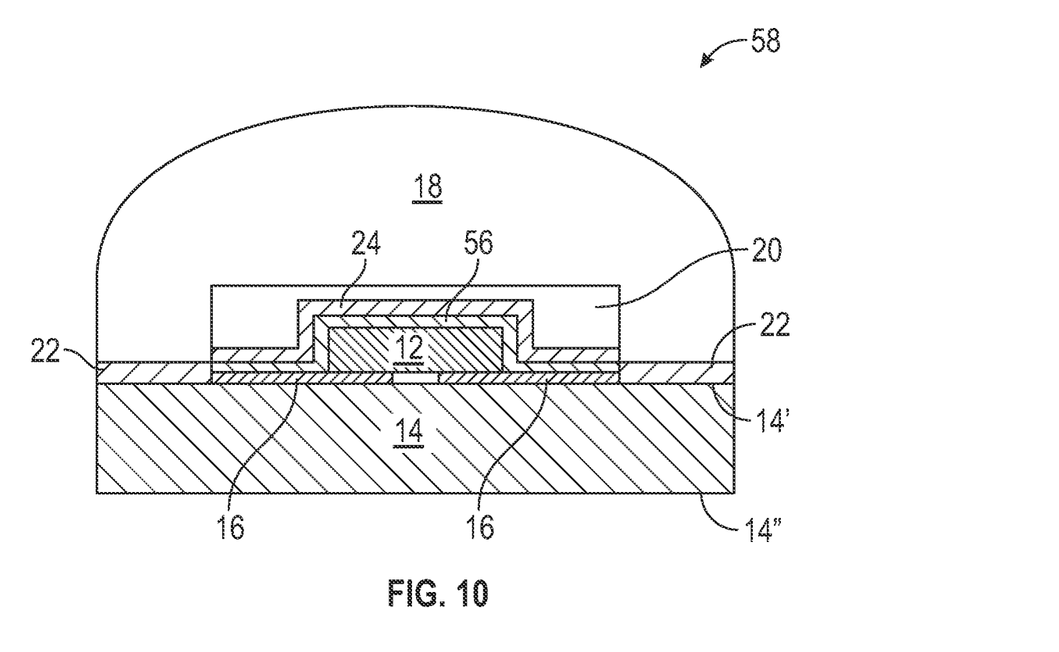
FIG. 10 is a cross-section of an LED package that is similar to the LED package of FIG. 9 except the lumiphoric material is arranged between the second seal and the LED chip.

FIG. 10 is a cross-section of an LED package 58 that is similar to the LED package 54 of FIG. 9 except the lumiphoric material 56 is arranged between the second seal 24 and the LED chip 12. In this manner, the lumiphoric material 56 is still arranged in light paths from the LED chip 12 for wavelength conversion. However, the second seal 24 may now provide enhanced protection for the lumiphoric material 56 from environmental ingress. In certain embodiments, the second seal 24 may from a hermetic seal as described above such that the lumiphoric material 56 is positioned underneath the airtight and/or watertight barrier provided by the second seal 24. As further illustrated in FIG. 10, the second seal 24 may contact the first seal 22 in certain embodiments.

Figure 11:
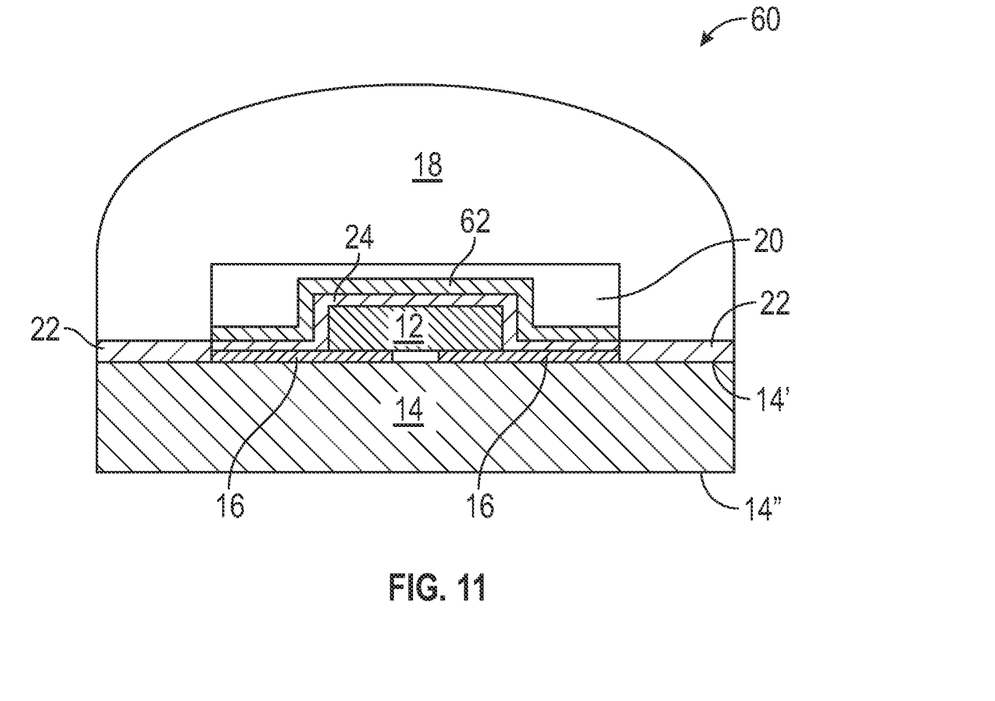
FIG. 11 is a cross-section of an LED package that is similar to the LED package of FIG. 1 for embodiments that include a third seal that is positioned on the second seal.

FIG. 11 is a cross-section of an LED package 60 that is similar to the LED package 10 of FIG. 1 for embodiments that include a third seal 62 that is positioned on the second seal 24. The third seal 62 may be provided as a thin film or coating over the second seal 24 and extending to the cover structure 18 in a similar manner as the second seal 24. The third seal 62 may embody a conformal coating that generally contours along a shape of the LED chip 12 and the second seal 24. In certain embodiments, the third seal 62 may also embody a hermetic seal. In other embodiments where the first seal 22 and/or the second seal 24 provide sufficient hermetic properties, the third seal 62 may comprise an organic material that effectively encapsulates the second seal 24 and forms a lower boundary of the cavity 20. In still further embodiments, the third seal 62 is a hermetic seal while the underlying second seal 24 comprises an organic material, such as silicone or epoxy.

Figure 12:
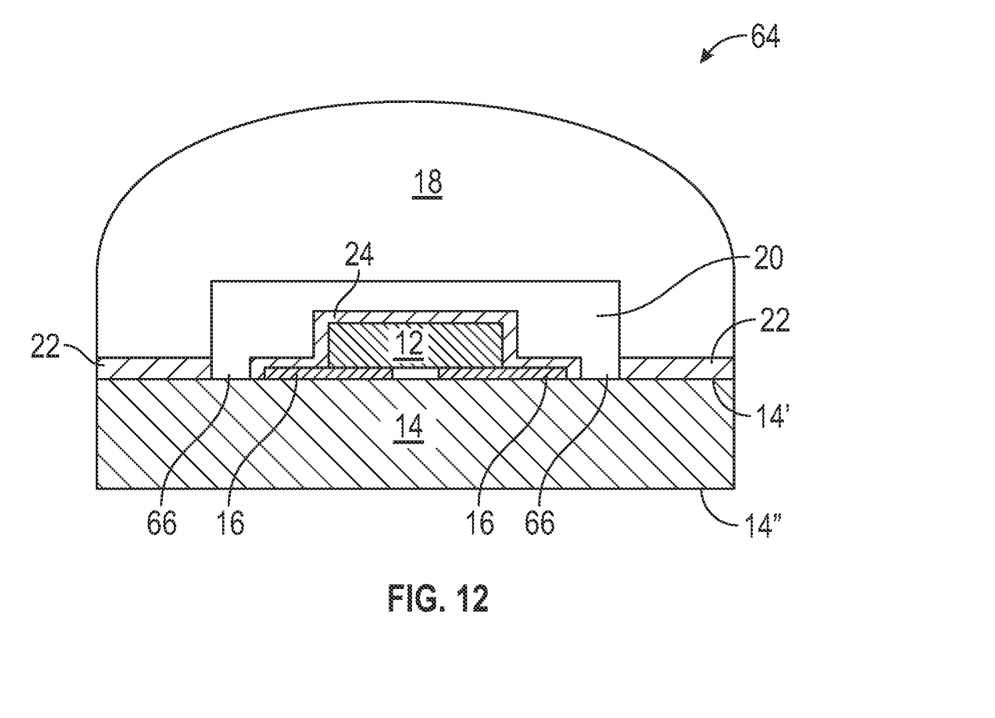
FIG. 12 is a cross-section of an LED package that is similar to the LED package of FIG. 1 for embodiments where the second seal does not extend all the way to the cover structure and the first seal.

FIG. 12 is a cross-section of an LED package 64 that is similar to the LED package 10 of FIG. 1 for embodiments where the second seal 24 does not extend all the way to the cover structure 18 and the first seal 22. In this manner, the second seal 24 may cover all surfaces of the LED chip 12 and a portion of the submount 14 within the cavity 20 such that a gap 66 is formed on the submount 14 between the second seal 24 and the first seal 22. The gap 66 may extend around an entire perimeter of the LED chip 12. As illustrated, the second seal 24 may extend past the metal traces 16 such that sidewalls or edges of the metal traces are covered by the second seal 24, effectively forming a barrier, such as another hermetic seal, for the LED chip 12 and the metal traces 16. Such embodiments may be advantageous for ensuring effective sealing of the LED chip 12 and/or the metal traces 16 by the second seal 24 while still leaving a suitable clearance as defined by the gap 66 for attaching the cover structure 18 to the submount 14 by the first seal 22.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:
1. A light-emitting diode (LED) package comprising:
    a submount comprising a first side and a second side that opposes the first side;
    at least one LED chip on the first side of the submount;
    a cover structure arranged over the at least one LED chip, the cover structure being attached to the submount to form a first seal between the cover structure and the submount, the first seal being a first hermetic seal; and a second seal on the LED chip and on a surface of the submount that is adjacent the LED chip, the second seal comprising inorganic materials, the first seal being attached to a first portion of the submount that is outside an area of the second seal on the surface of the submount.

2. The LED package of claim 1, wherein the second seal is a second hermetic seal.

3. The LED package of claim 1, further comprising a metal trace on the first side of the submount, the metal trace forming at least one reflective surface for the at least one LED chip, wherein the second seal is on a surface of the metal trace.

4. The LED package of claim 1, wherein the cover structure forms a cavity on the submount, the second seal and the at least one LED chip are positioned within the cavity, and the second seal covers all surfaces of the at least one LED chip and the submount that are within the cavity such that the cavity is bounded by the cover structure and the second seal.

5. The LED package of claim 1, wherein the cover structure forms a cavity on the submount, and the second seal covers all surfaces of the at least one LED chip and a second portion of the submount within the cavity such that a gap is formed on the submount between the second seal and the first seal.

6. The LED package of claim 1, wherein a portion of the second seal is in contact with the first seal.

7. The LED package of claim 1, wherein the second seal comprises a thickness that is less than a thickness of the at least one LED chip as measured in a direction perpendicular to the submount.

8. The LED package of claim 1, wherein a thickness of the second seal is in a range from 1 nanometer (nm) to 20 microns (μm) as measured in a direction perpendicular to the submount.

9. The LED package of claim 1, wherein the cover structure forms a cavity on the submount, and the second seal comprises an index of refraction that is intermediate an index of refraction for the at least one LED chip and an index of refraction for an environment of the cavity.

10. The LED package of claim 1, wherein the cover structure forms a curved lens or a flat lens above the at least one LED chip.

11. The LED package of claim 1, wherein the first seal comprises a metal-to-metal eutectic bond, a solder bond, a glass bond, or a ceramic bond.

12. The LED package of claim 1, further comprising a spacer on the submount, wherein the first seal is formed between the spacer and the cover structure.

13. The LED package of claim 1, further comprising a lumiphoric material, wherein the second seal is arranged between the lumiphoric material and the at least one LED chip.

14. The LED package of claim 1, further comprising a lumiphoric material, wherein the lumiphoric material is arranged between the second seal and the at least one LED chip.

15. The LED package of claim 1, further comprising a third seal on the second seal, wherein at least one of the second seal and the third seal is a second hermetic seal.

16. The LED package of claim 1, wherein the at least one LED chip is configured to provide a peak wavelength in a range from 100 nanometers (nm) to 400 nm.

17. A light-emitting diode (LED) package comprising:
a submount comprising a first side and a second side that opposes the first side;
at least one LED chip on the first side of the submount;
a cover structure arranged over the at least one LED chip, the cover structure being attached to the submount to form a first seal between the cover structure and the submount; and
a second seal on the LED chip and on a surface of the submount that is adjacent the at least one LED chip, the second seal being a hermetic seal that is between the cover structure and the at least one LED chip, the first seal being attached to a first portion of the submount that is outside an area of the second seal on the surface of the submount.

18. The LED package of claim 17, wherein the cover structure forms a cavity on the submount, and the hermetic seal and the at least one LED chip are positioned within the cavity.

19. The LED package of claim 17, wherein the first seal comprises an organic material and the second seal comprises an inorganic material.

20. The LED package of claim 17, wherein the first seal comprises another hermetic seal.

21. The LED package of claim 17, further comprising a metal trace on the first side of the submount, the metal trace forming at least one reflective surface for the at least one LED chip, wherein the second seal is on a surface of the metal trace.

22. The LED package of claim 17, wherein the at least one LED chip is configured to provide a peak wavelength in a range from 100 nanometers (nm) to 400 nm.

* * * * *